United States Patent
Rolla et al.

(10) Patent No.: US 7,032,277 B2
(45) Date of Patent: Apr. 25, 2006

(54) CABLE MANAGEMENT SYSTEM AND METHOD OF USE THEREOF

(75) Inventors: Michael P. Rolla, Maynard, MA (US); Denise M. Masson, Dracut, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 156 days.

(21) Appl. No.: 10/682,868

(22) Filed: Oct. 14, 2003

(65) Prior Publication Data

US 2005/0076479 A1    Apr. 14, 2005

(51) Int. Cl.
*A44B 21/00* (2006.01)

(52) U.S. Cl. ......................................... 24/302; 361/826

(58) Field of Classification Search .................. 24/306, 24/298–302; 224/275; 361/683, 724, 727, 361/753, 797, 803, 825–827; 174/128.2, 174/168; 248/68.1, 74.2; 439/571, 572
See application file for complete search history.

(56) References Cited

U.S. PATENT DOCUMENTS

| | | | |
|---|---|---|---|
| 5,702,039 A * | 12/1997 | Olaiz | 224/251 |
| 6,250,526 B1 * | 6/2001 | Bess | 224/275 |
| 6,407,933 B1 * | 6/2002 | Bolognia et al. | 361/826 |
| 6,501,020 B1 * | 12/2002 | Grant et al. | 361/608 |
| 6,581,791 B1 * | 6/2003 | Flint et al. | 213/1.3 |
| 6,646,893 B1 * | 11/2003 | Hardt et al. | 361/826 |
| 6,707,978 B1 * | 3/2004 | Wakileh et al. | 385/134 |
| 6,745,910 B1 * | 6/2004 | Flint et al. | 213/1.3 |
| 6,871,732 B1 * | 3/2005 | Flint et al. | 361/826 |
| 2002/0008125 A1 * | 1/2002 | Caputi | 224/257 |

* cited by examiner

*Primary Examiner*—Robert J. Sandy
*Assistant Examiner*—Ruth C. Rodriguez

(57) ABSTRACT

What is disclosed is a cable management system having a flexible main strap with an upper portion adapted to be secured to a first supporting surface in an electronic device, a middle portion with a plurality of mini straps attached thereon, and a lower portion adapted to be secured to a second supporting surface in the electronic device. The mini straps are capable of forming loops around a cable or cable assembly to restrict movement of the cable or cable assembly. Also disclosed is a method for managing cables in an electronic device. The method contains the steps of: attaching an upper portion of a main strap having a plurality of mini straps attached thereon to a first surface on the electronic device; organizing cables in the electronic device using the mini straps attached to the main strap; and attaching a lower portion of the main strap to a second surface on the electronic device.

16 Claims, 7 Drawing Sheets

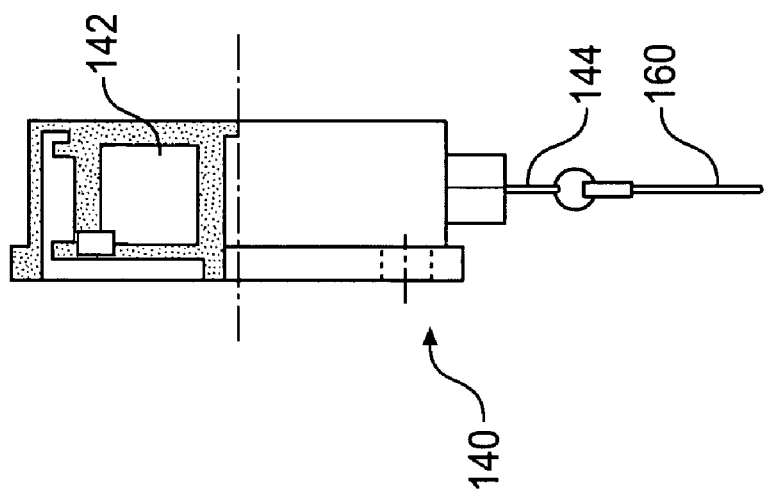
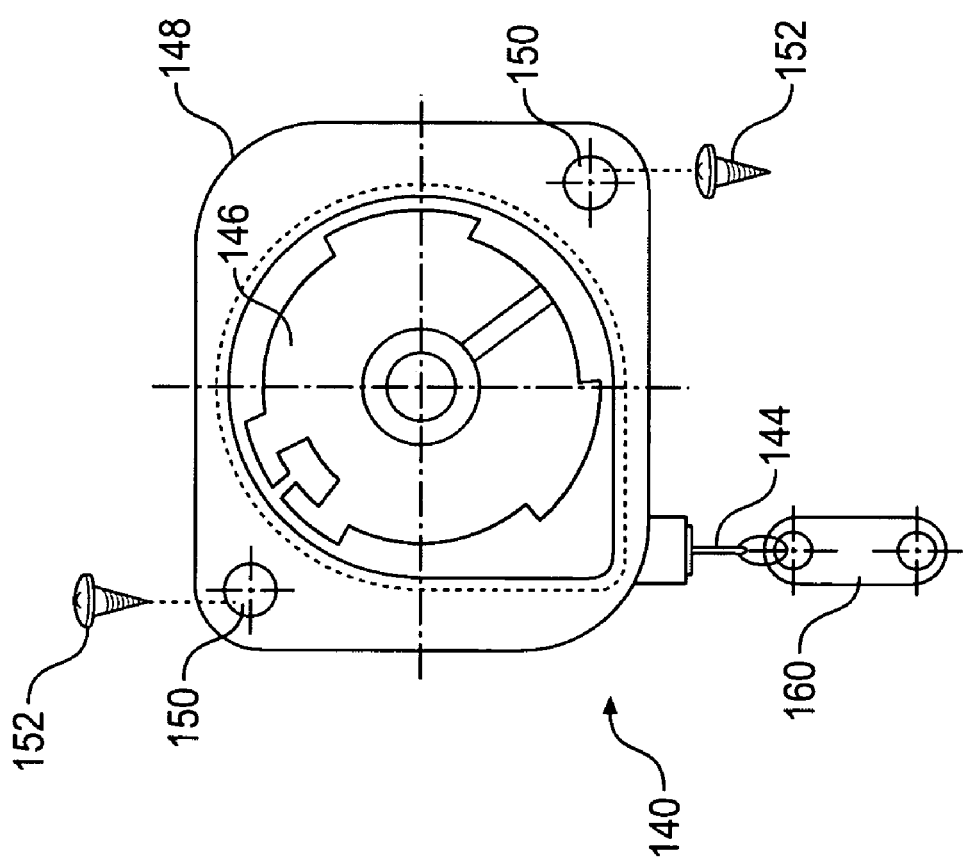
*FIG. 2B*
*FIG. 2A*

CABLE MANAGEMENT SYSTEM AND METHOD OF USE THEREOF

TECHNICAL FIELD

The technical field is electronic devices and, in particular, cable management system for complex electronic devices.

BACKGROUND

Complex electronic systems such as computer server and network equipments are usually mounted in open racks or closed cabinets. Typically, the various components of an electronic system are interconnected to each other electronically by a large number of individual cables that may physically interfere with access to the components. The more cables that must be moved to gain access to a component, the longer the time is required to service or replace the component. Moreover, in the process of moving cables aside to reach the component, one may also inadvertently cause partial cable disconnections, further slowing maintenance and repair activities. Accordingly, a need exists for a cable management system and method that organizes cables in a way that minimizes the numbers of cables that must be moved or otherwise manipulated in order to gain access to the components of a complex electronic device.

One requirement for a cable management system is space efficiency. A typical complex electronic device, such as a computer server, has limited rack or cabinet real estate. There may not be sufficient space on a rack or in a cabinet to install a cable management system that itself requires a significant amount of space. Another requirement is efficient airflow. Most electronic devices use air-cooling mechanisms, such as fans, to dissipate heat generated during operation. Accordingly, proper airflow within the chassis of the electronic device is critical for maintaining the normal working condition of the electronic device. A cable management system should not interfere with the air circulation around the electronic device. Yet another requirement is that the cable management system manages cables without damaging individual cables. This is of a particular concern in the handling of fiber-optic cables, which have a high failure rate in network hardware installation applications. The glass core of fiber-optic cables will crack and break if the cables are bent more than a specified bend radius. In addition to these requirements, the cable management system should organize the cables into discrete groupings readily identifiable and associated with each specific hardware component, thereby providing rapid identification of the associated cables and speeding up the service process. Finally, the cable management system should have the flexibility to adapt to electronic devices of different dimensions and can be easily removed and reinstalled for major services or repairs of the electronic devices.

SUMMARY

What is disclosed is a cable management system having a flexible main strap with an upper portion adapted to be secured to a first supporting surface in an electronic device, a middle portion with a plurality of mini straps attached thereon, and a lower portion adapted to be secured to a second supporting surface in the electronic device. The mini straps are capable of forming loops around a cable or cable assembly to restrict movement of the cable or cable assembly. Also disclosed is a method for managing cables in an electronic device. The method includes the steps of: attaching an upper portion of a main strap having a plurality of mini straps attached thereon to a first surface on the electronic device; organizing cables in the electronic device using the mini straps attached to the main strap; and attaching a lower portion of the main strap to a second surface on the electronic device.

BRIEF DESCRIPTION OF FIGURES

The detailed description will refer to the following drawings, in which like numerals refer to like elements, and in which:

FIG. 2 shows an embodiment of a tensioner.

DETAILED DESCRIPTION

Figure 1A:
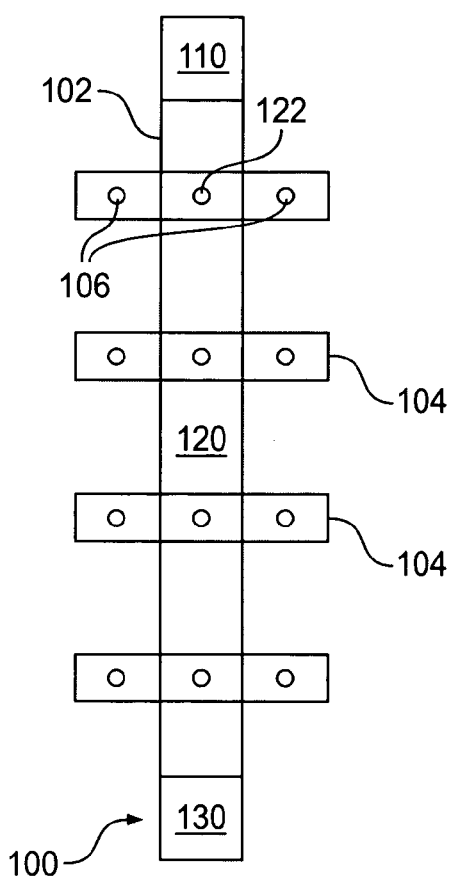
FIG. 1 shows an embodiment of a cable management system.

FIG. 1A shows a cable management system 100 that contains a flexible main strap member 102 and a plurality of flexible mini strap members 104. The main strap member 102 has an upper portion 110, a middle portion 120, and a bottom portion 130. The top portion 110 and lower portion 130 are adapted to be mounted, directly or indirectly, to a frame or chassis of an electronic device. The mini strap members 104 are removably or permanently attached to the middle portion 120 of the main strap member 102 by attachment means 122. Each mini strap member 104 also contains a fastening means 106, such as a button, a snap hook, or Velcro, to secure cables.

The main strap member 102 and mini strap members 104 can be made of any flexible material having the requisite strength, the heat, humidity, and chemical resistance, and the insulating characteristics required for a particular application. Examples include, but are not limited to, polyester, polypropylene, polyimide, fluoroelastomer, acrylic, cyclic olefin copolymer (COC), urethanes, polymethylmethacrylate (PMMA), polycarbonate, polytetrafluoroethylene, polyvinylchloride, polydimethylsiloxane, polysulfone, siloxane, polyamide, plastic laminated paper, seat belt webbing, Velcro, and other flexible material known in the art.

Figure 1B:
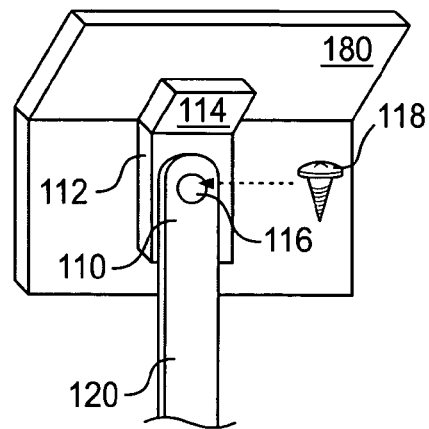
Figure 1C:
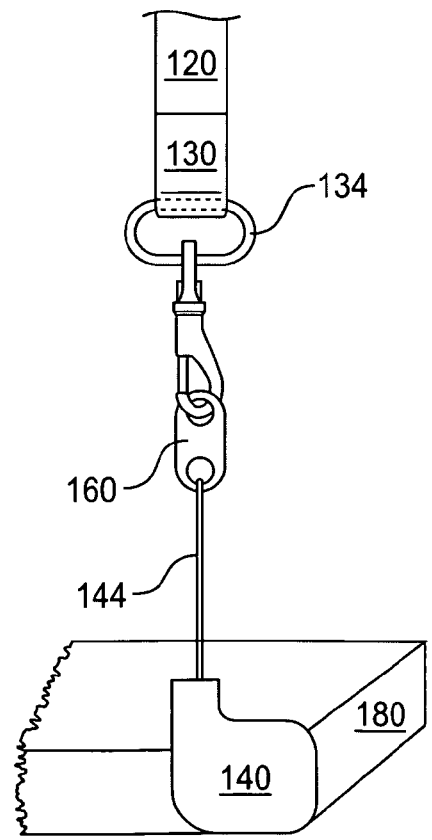

FIG. 1B shows an embodiment of an attachment assembly 112 that can be used to secure the upper portion 110 or the lower portion 130 of the main strap 102 to a chassis 180 of an electronic device. The attachment assembly 112 contains an L-bracket 114 having one or more mounting holes 116, and one or more self-threading screws 118 for securing the L-bracket 114 to the chassis 180. Referring to FIG. 1C, in an embodiment, the lower portion 130 of the main strap 102 contains a swivel snap hook 134 that is attached to a tensioner assembly 140 mounted on the chassis 180 of the electronic device through, a receptacle 160 and a cable 144. Alternatively, the lower portion 130 of the main strap 102 can be attached to the tensioner 140 using any connecting means known to one skilled in the art. The use of the tensioner assembly 140 prevents the swirling movement of the lower portion 130 of the main strap member 102, while allowing the entire cable management system 100 to be moved to provide access to various components of the electronic device during service.

As shown in FIGS. 2A and 2B, the tensioner assembly 140 contains a spring 142, a cable 144, a cable reel 146, and a housing 148 that houses the spring 142, the cable 144 and the cable reel 146. One end of the cable 144 is attached to the cable reel 146, while the other end of the cable 144 is attached to a receptacle 160 having a loop like structure to be attached to the swivel snap hook 134 (see FIG. 1C). The housing 148 also contains at least one and preferably two mounting holes 150 so that the tensioner assembly 140 can be mounted to the chassis of an electronic device by screws 152. The housing 140, cable 144, cable reel 146 and receptacle 160 can be made of any material having the requisite strength, the heat, humidity, and chemical resistance, and the insulating characteristics required for a particular application. The spring 142 is selected based on the tension requirements of a particular application.

Figure 3:
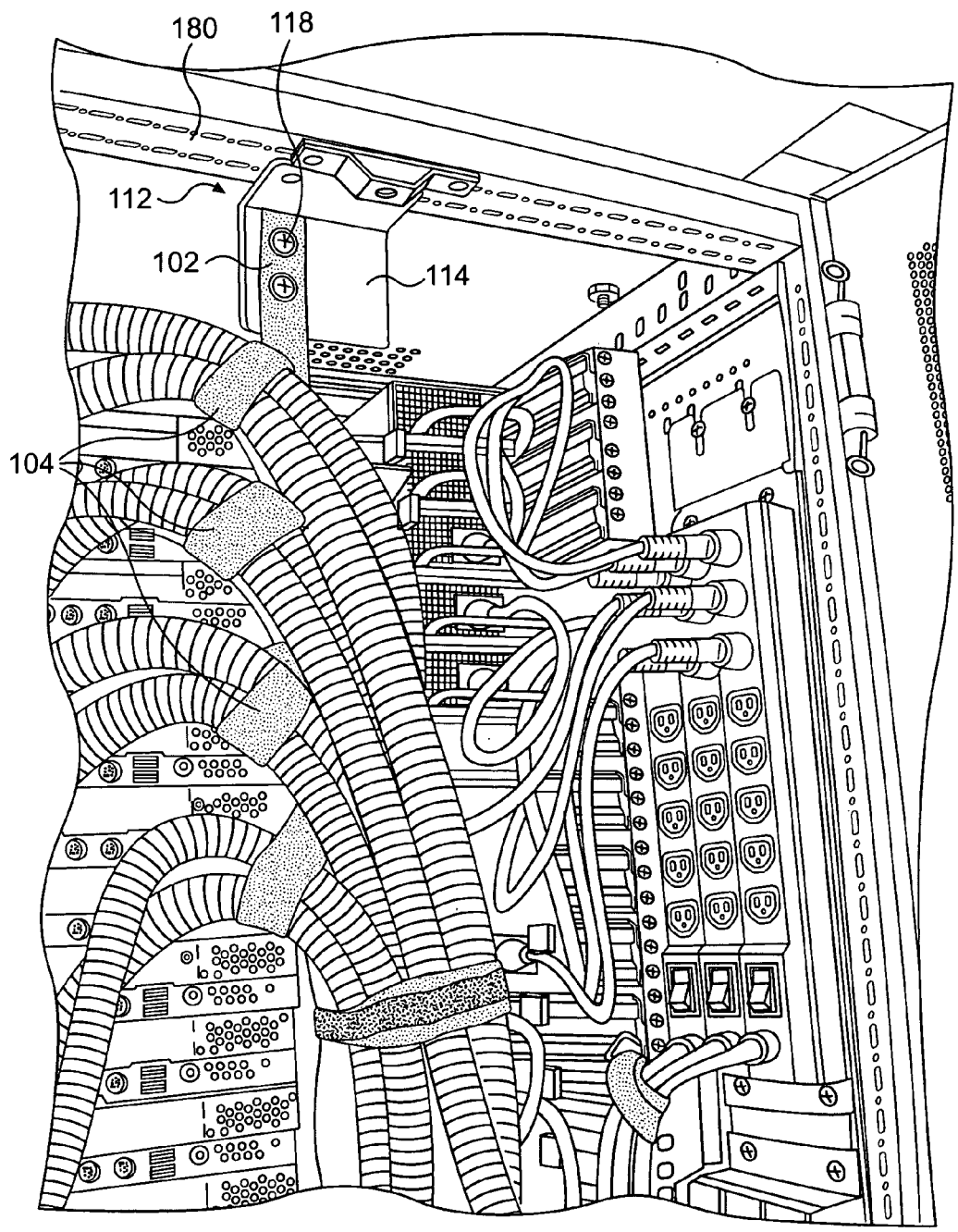
FIG. 3 shows the mounting of the upper portion of the cable management system in an electronic device.
Figure 4:
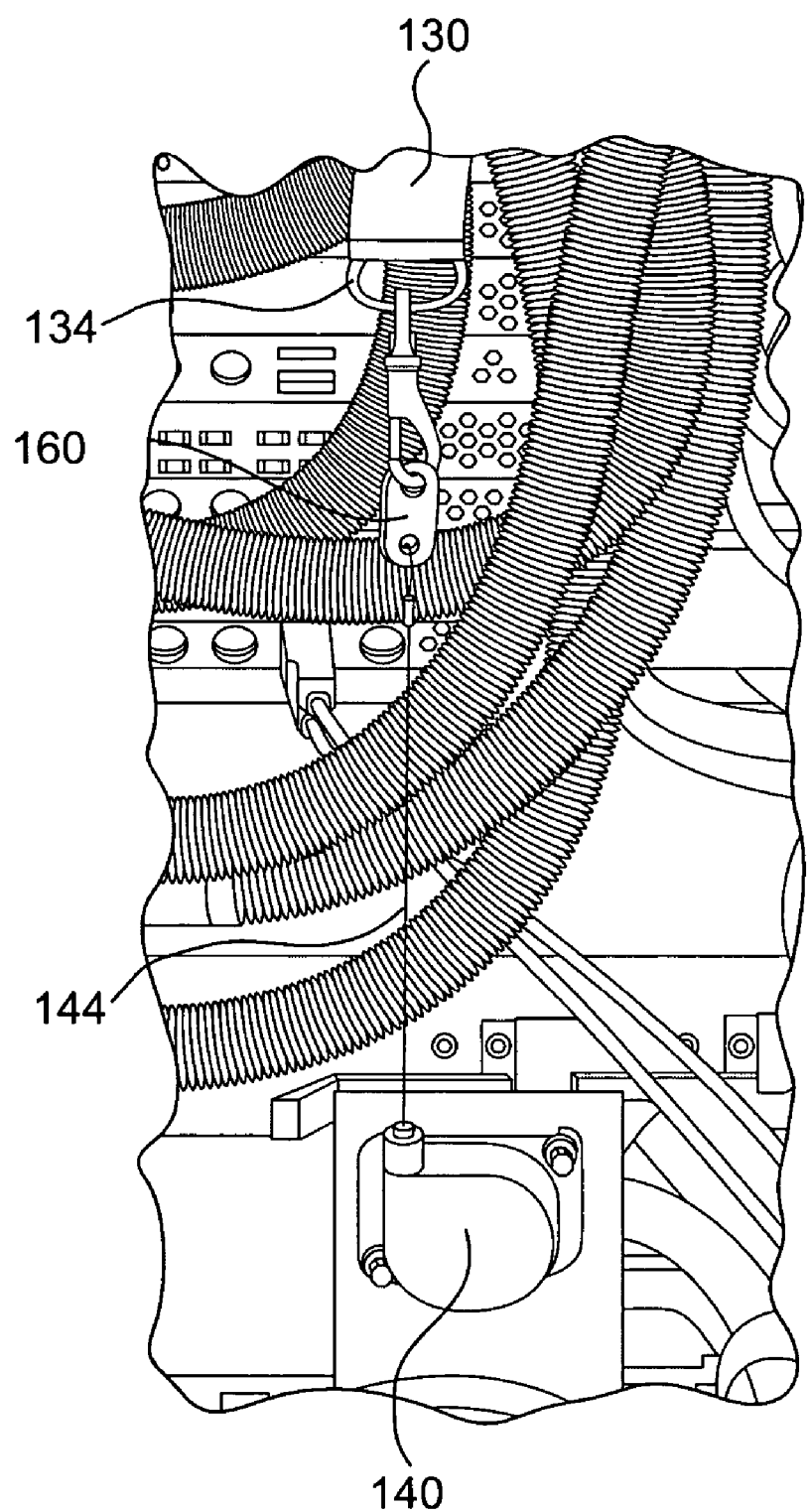
FIG. 4 shows the mounting the lower portion of the cable management system in an electronic device using a tensioner.
Figure 5:
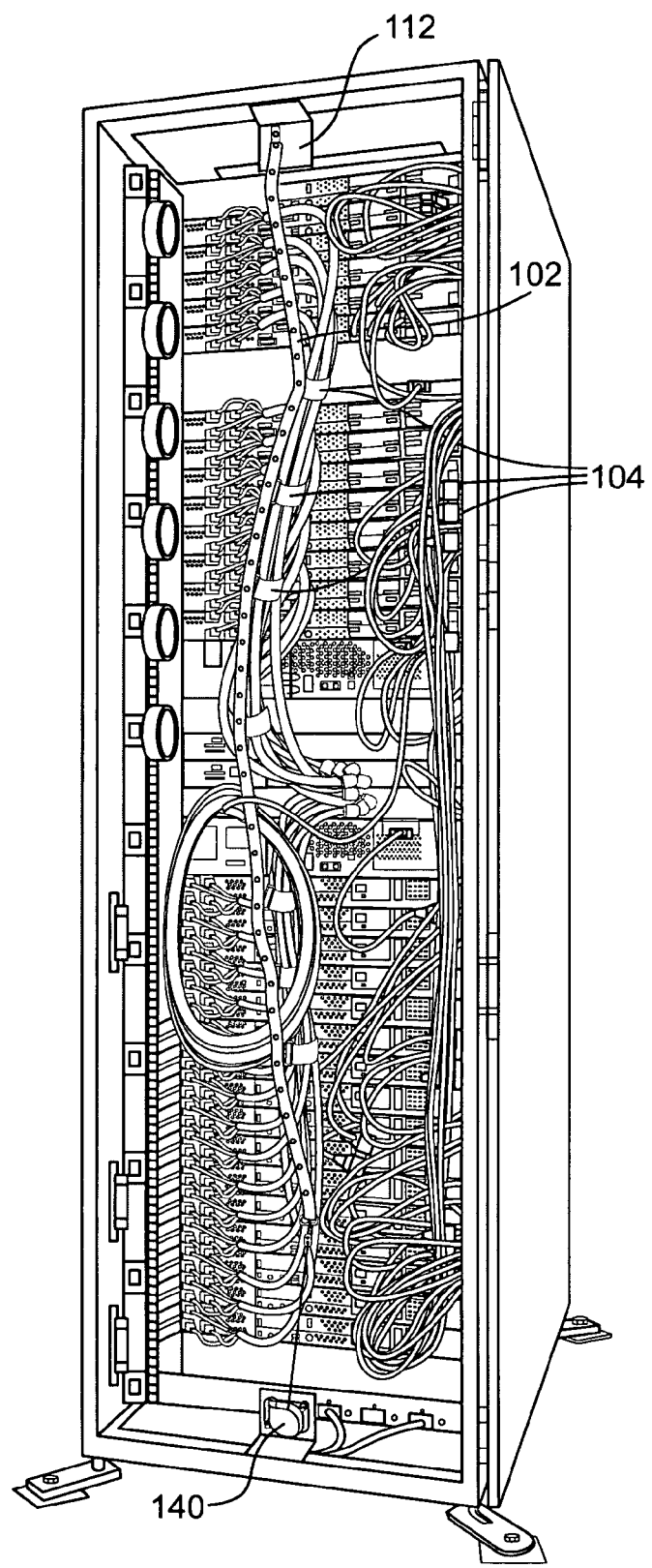
FIG. 5 shows the entire cable management system and cable assembly in an electronic device.
Figure 6:
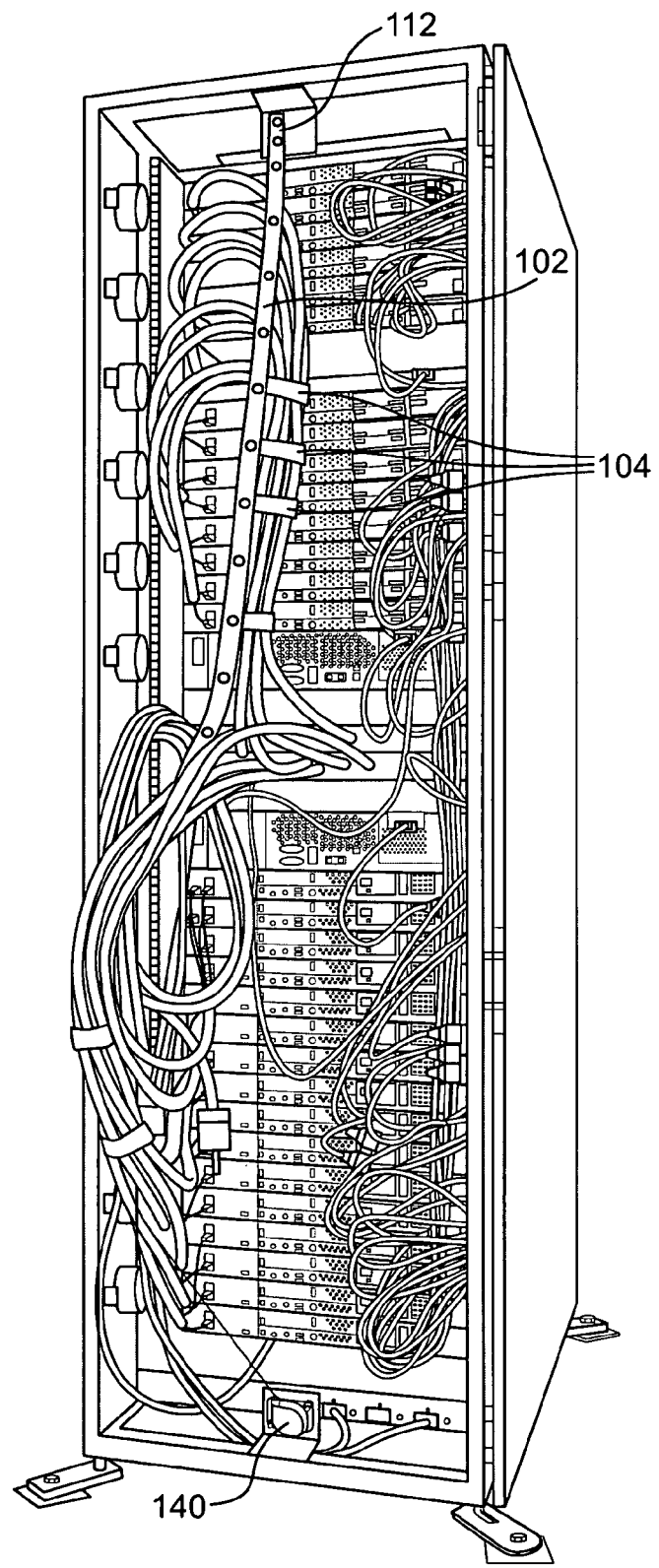
FIG. 6 shows how the entire cable assembly can be moved without disconnecting the cables.

FIGS. 3–6 illustrate an application of the cable management system 100 in a computer server. As shown in FIGS. 3 and 4, the top portion 110 of the main strap member 102 is mounted on the upper frame of the computer server using the L-bracket 114 and the self-threading screws 116 (FIG. 3); while the lower portion 130 of the main strap member 102 is attached to the tensioner 140 mounted on the lower frame of the computer server (FIG. 4). FIG. 5 shows the entire cable assembly of the computer server managed by the cable management system 100. FIG. 6 illustrates that the entire cable assembly can be moved without disconnecting the cables.

As demonstrated by FIGS. 1–6, the cable management system 100 occupies minimal rack space and provides efficient management of cable assemblies in an electronic device without interfering the air circulation around the electronic device. The flexibility of the main strap 102 and the flexible positioning of the mini straps 104 allow the cable management system 100 to organize cables and cable assemblies in such as manner so that the specific bending requirements of different cables are satisfied. The cable management system 100 can be made of varying length to adopt electronic devices of different sizes. Because of its simple design, the cable management system 100 can be manufactured at low cost.

Figure 7:
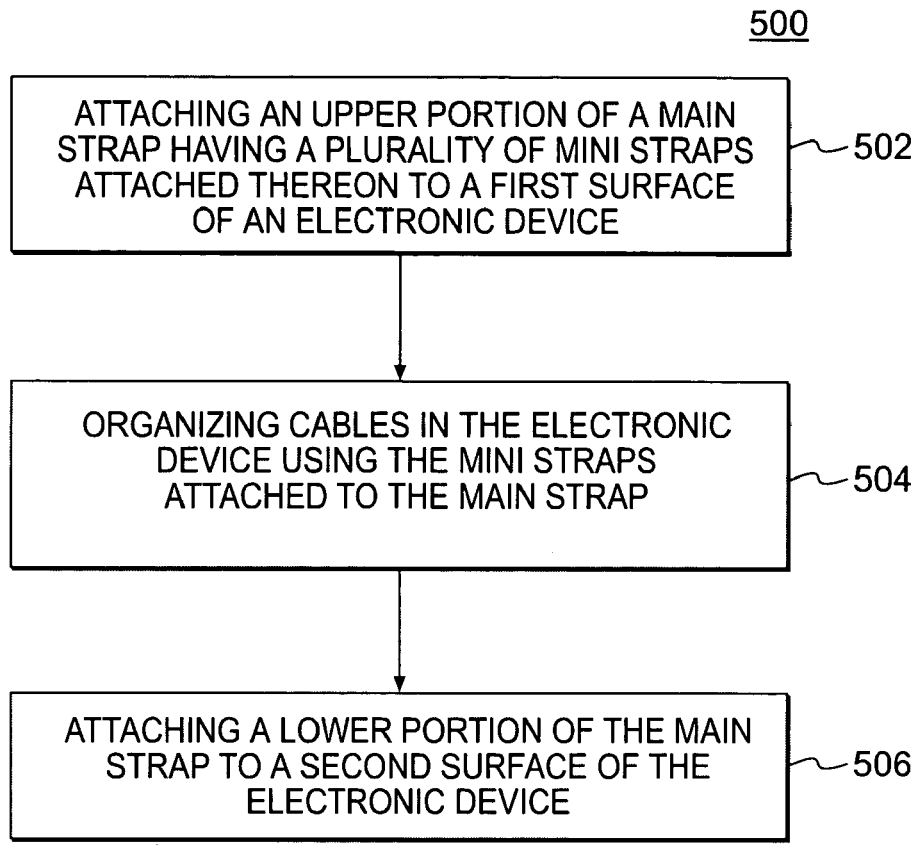
FIG. 7 is a block diagram showing a method for using the cable management system.
Figure 8:
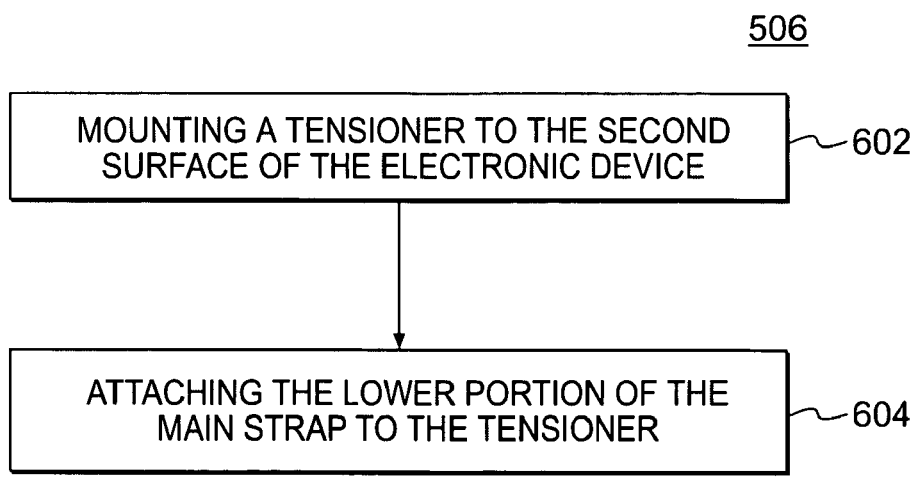
FIG. 8 is a block diagram showing additional steps in the method described in FIG. 7.

FIG. 7 describes a method 500 for using the cable management system 100. The method 500 include the steps of: attaching an upper portion of a main strap having a plurality of mini straps attached thereon to a first surface of an electronic device (step 502), organizing cables in the electronic device using the mini straps attached to the main strap (step 504), and attaching a lower portion of the main strap to a second surface of the electronic device (step 506). In one embodiment, the step 506 further includes the steps of mounting a tensioner to the second surface of the electronic device (step 602, FIG. 8) and attaching the lower portion of the main strap to the tensioner (step 604, FIG. 8).

Although preferred embodiments and their advantages have been described in detail, various changes, substitutions and alterations can be made herein without departing from the scope of the devices and methods as defined by the appended claims and their equivalents.

We claim:
1. A cable management system, comprising:
a flexible main strap comprising an upper portion adapted to be secured to a first supporting surface, a middle portion, and a lower portion adapted to be secured to a second supporting surface;
a plurality of removable and reattachable mini straps attached to the middle portion of the main strap and forming loops around a cable or cable assembly to restrict movement of the cable or cable assembly; and
a tensioner for flexibly securing the lower portion of the main strap to the second supporting surface.
2. The cable management system of claim 1, wherein the upper portion of the main strap comprises attachment means for mounting the upper portion to the first supporting surface.
3. The cable management system of claim 2, wherein the attachment means comprises an L-bracket and at least one screw.
4. The cable management system of claim 1, wherein the lower portion of the main strap comprises means for attaching to the tensioner.
5. The cable management system of claim 4, wherein the means for attaching to the tensioner is a snap hook.
6. The cable management system of claim 1, wherein the tensioner comprises a spring, a cable reel, a cable having one end attached to the cable reel and another end attached to a receptacle, and a housing.
7. The cable management system of claim 1, wherein the tensioner is mounted on the second supporting surface by at least one screw.
8. The cable management system of claim 1, wherein the main strap and mini straps comprise at least one of polyester, polypropylene, polyimide, fluoroelastomer, acrylic, cyclic olefin copolymer (COC), urethane, polymethylmethacrylate (PMMA), polycarbonate, polytetrafluoroethylene, polyvinylchloride, polydimethylsiloxane, polysulfone, siloxane, polyamide, plastic laminated paper, seat belt webbing, and hook-and-loop fasteners.
9. The cable management system of claim 8, wherein the main strap comprises hook-and-loop fasteners.
10. The cable management system of claim 8, wherein the main straps comprise seat belt webbing.
11. The cable management system of claim 8, wherein the mini straps comprise hook-and-loop fasteners.
12. A cable management system kit, comprising:
a flexible main strap comprising an upper portion adapted to be secured to a first supporting surface, a middle portion, and a lower portion adapted to be secured to a second supporting surface, and
a plurality of mini straps removably attached to the middle portion of the main strap and forming loops around a cable or cable assembly to restrict movement of the cable or cable assembly;
an L-bracket for attaching the upper portion of the main strap to the first supporting surface; and
a tensioner for flexibly attaching the lower portion of the main strap to the second supporting surface.
13. A method for managing cables in a complex electronic device, comprising:
attaching an upper portion of a main strap to a first surface on the electronic device, wherein the main strap comprising a plurality of removable and reattachable mini straps attached thereon;
organizing cables in the electronic device using the mini straps attached to the main strap; attaching a tensioner to a second surface on the electronic device; and attaching a lower portion of the main strap to the tensioner.

14. The method of claim 13, further comprising:

attaching a plurality of mini straps to the main strap.

15. A cable management system, comprising:

a flexible main strap comprising an upper portion adapted to be secured to a first supporting surface, a middle portion, and a lower portion adapted to be secured to a second supporting surface;

a plurality of removable and reattachable mini straps attached to the middle portion of the main strap, wherein the mini straps comprise fasteners for forming loops around a cable or cable assembly to restrict movement of the cable or cable assembly; and a tensioner for flexibly securing the lower portion of the main strap to the second supporting surface.

16. The cable management system of claim 15, wherein the fasteners on the mini straps are hook-and-loop fasteners.

* * * * *